United States Patent [19]
Ohashi et al.

[11] Patent Number: 4,910,550
[45] Date of Patent: Mar. 20, 1990

[54] IMAGE FORMATION APPARATUS WITH SUPPLEMENTAL LIGHT SOURCE

[75] Inventors: Kunio Ohashi; Syoichi Nagata; Yoshiharu Tsujimoto, all of Nara, Japan

[73] Assignee: Sharp Kabushiki Kaisha, Osaka, Japan

[21] Appl. No.: 224,937

[22] Filed: Jul. 27, 1988

[30] Foreign Application Priority Data

Aug. 7, 1987 [JP] Japan ................... 62-198746
Oct. 14, 1987 [JP] Japan ................... 62-259270
Oct. 14, 1987 [JP] Japan ................... 62-259273
Oct. 23, 1987 [JP] Japan ................... 62-268792

[51] Int. Cl.$^4$ .................. G03B 27/32; G03B 27/52
[52] U.S. Cl. ................................. 355/27; 355/32; 355/35; 430/138
[58] Field of Search .............. 355/32, 35, 27, 77; 430/138; 354/301, 303, 304

[56] References Cited

U.S. PATENT DOCUMENTS

| | | |
|---|---|---|
| 4,742,374 | 5/1988 | Yamamoto et al. .............. 355/27 |
| 4,770,972 | 9/1988 | Nelson et al. .................. 430/138 |
| 4,772,922 | 9/1988 | Kawahara et al. .............. 355/32 |
| 4,825,256 | 4/1989 | Nakai et al. .................. 355/32 X |

*Primary Examiner*—Richard A. Wintercorn
*Attorney, Agent, or Firm*—Flehr, Hohbach, Test, Albritton & Herbert

[57] ABSTRACT

For an image formation apparatus having supplemental light sources in addition to an optical system for providing an image forming light beam reflected from an original to be copied, a control unit controls exposure by these supplemental light sources according to the photosensitivity characteristics of microcapsules of different kinds with which a light-receiving sheet is coated and which respond differently to individual beams from the supplemental light sources. The control unit may also be designed to take into consideration the effects of ambient humidity and the user's choice for particular coloring.

11 Claims, 11 Drawing Sheets

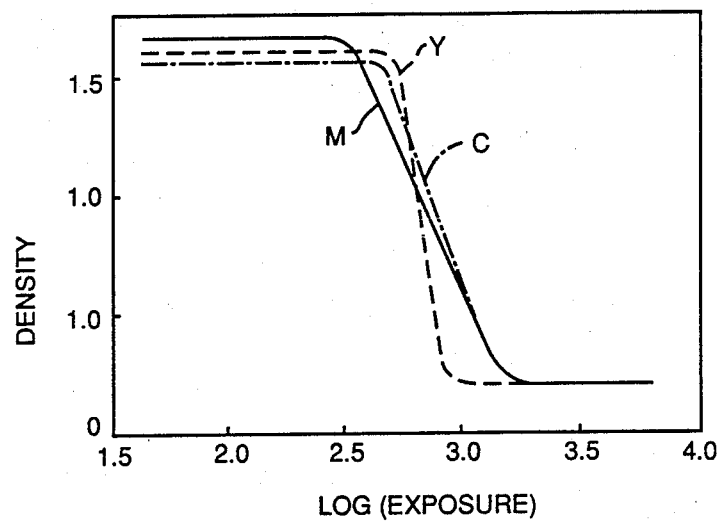
FIG._1
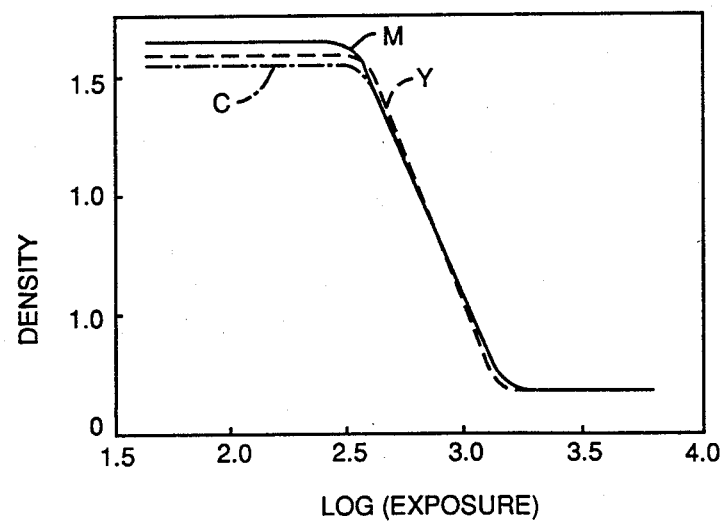
FIG._3

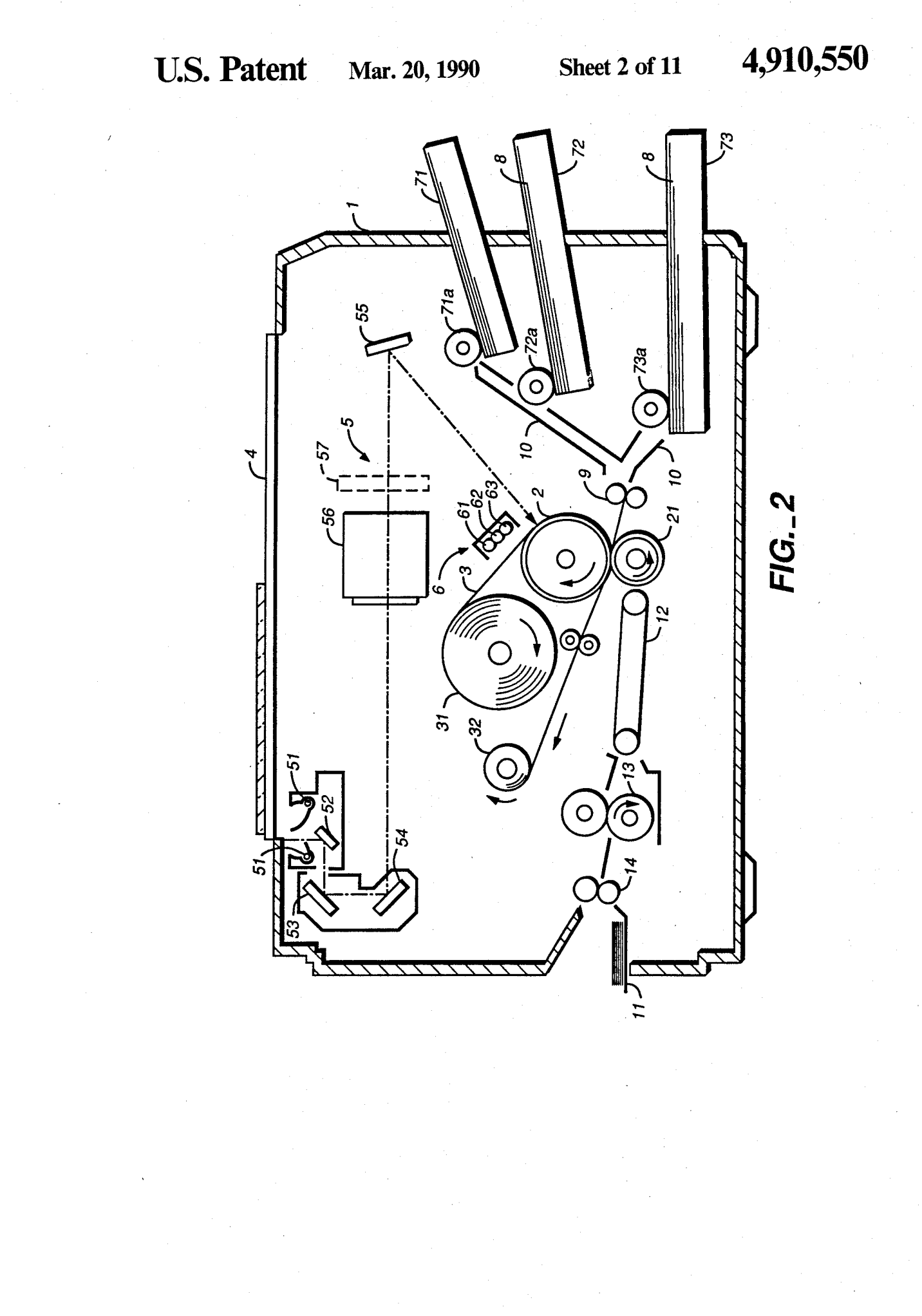

FIG._2

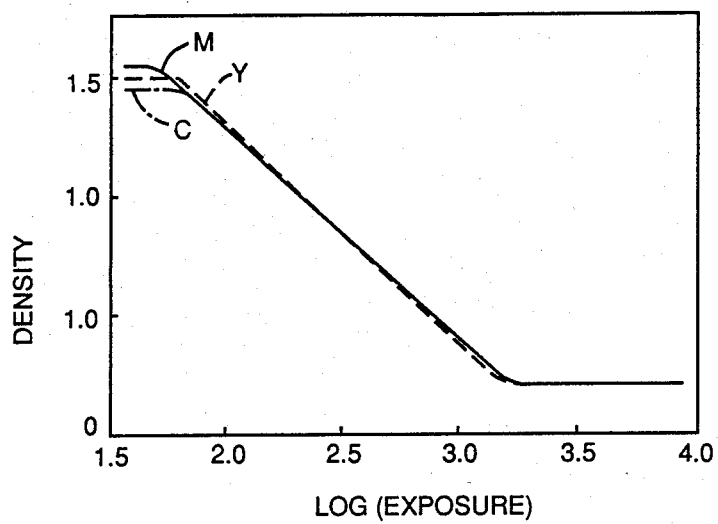
FIG._4
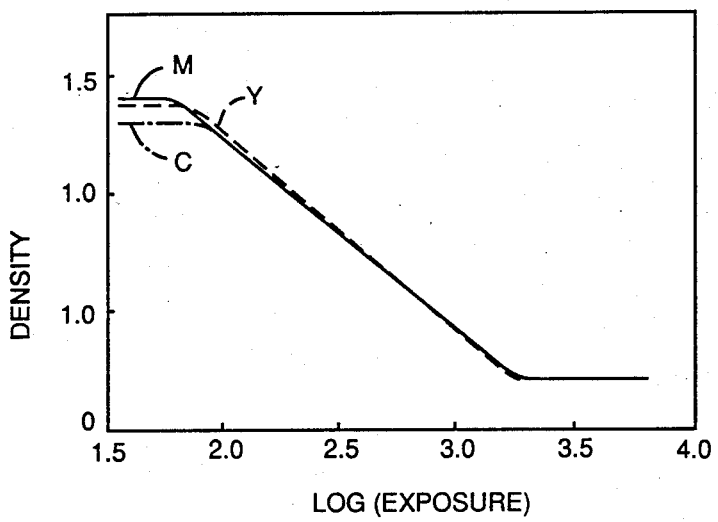
FIG._5

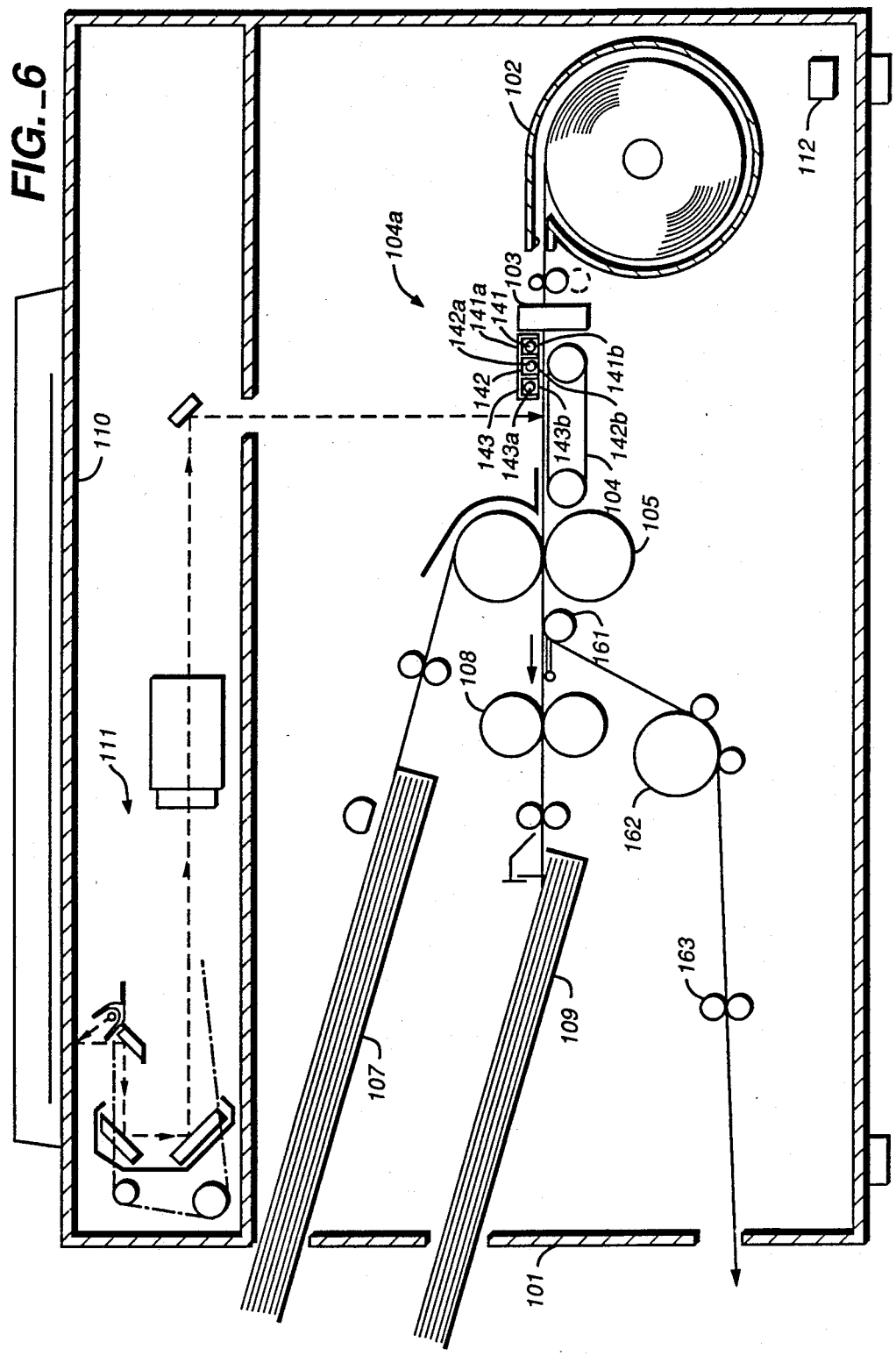

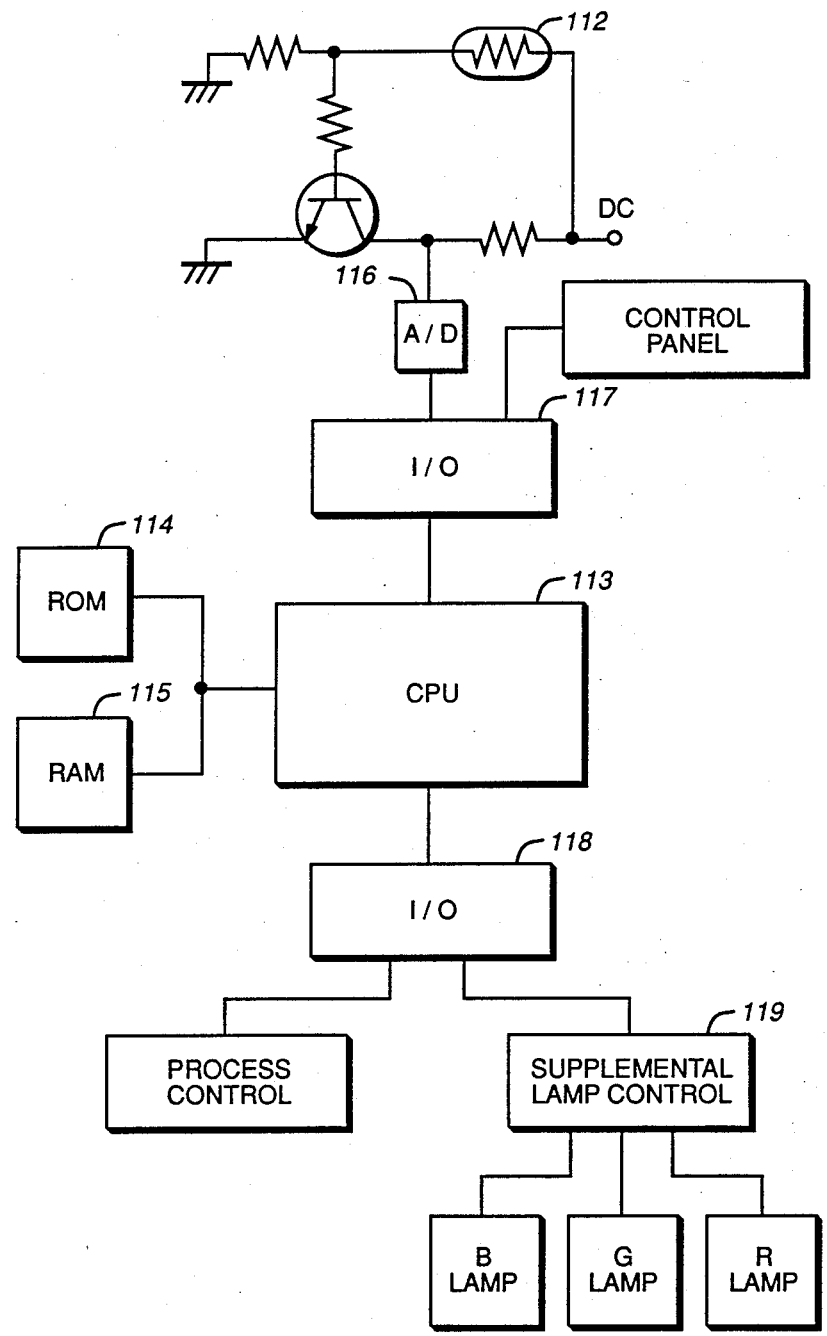
FIG._7

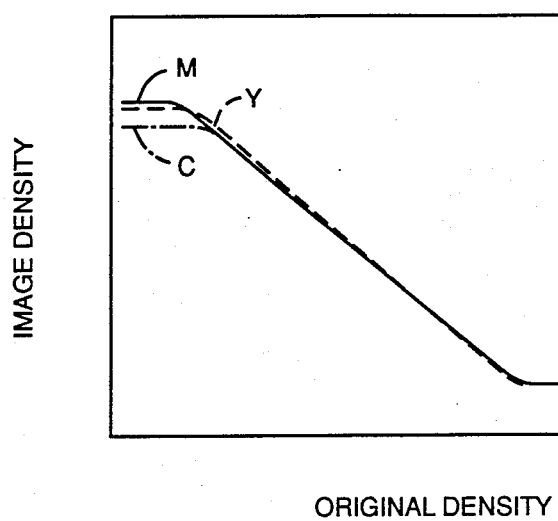
ORIGINAL DENSITY
*FIG._8*
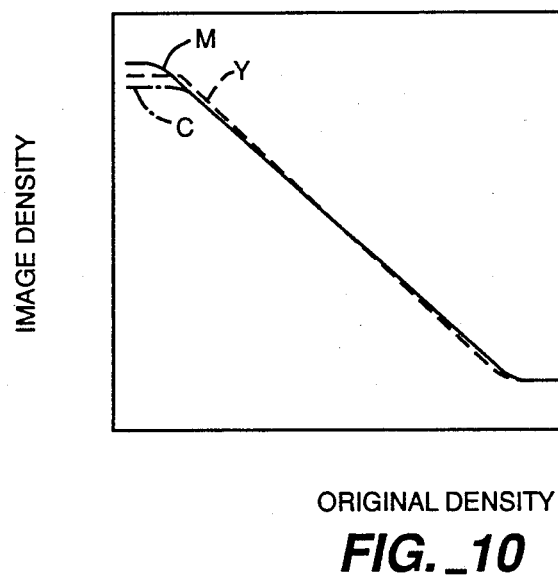
ORIGINAL DENSITY
*FIG._10*

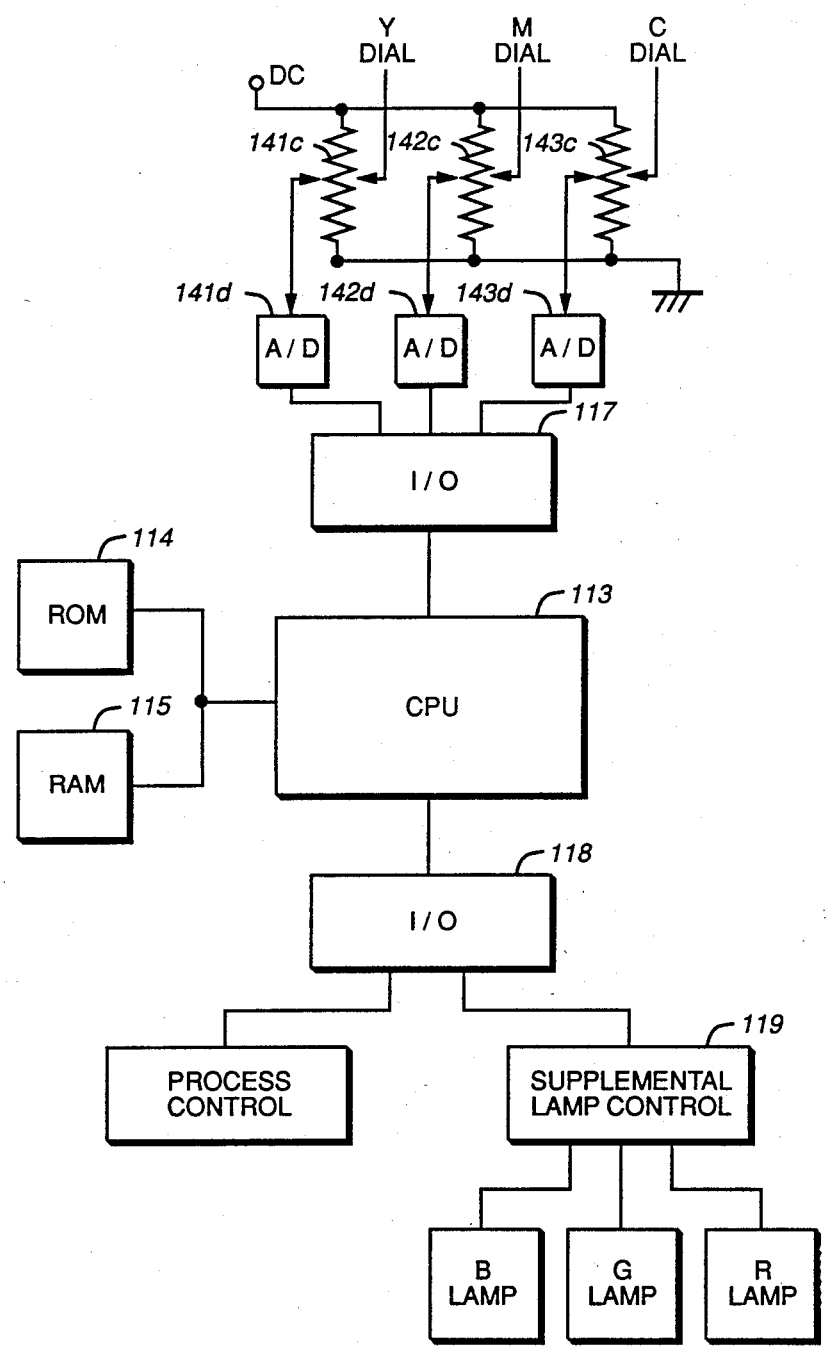
FIG._9

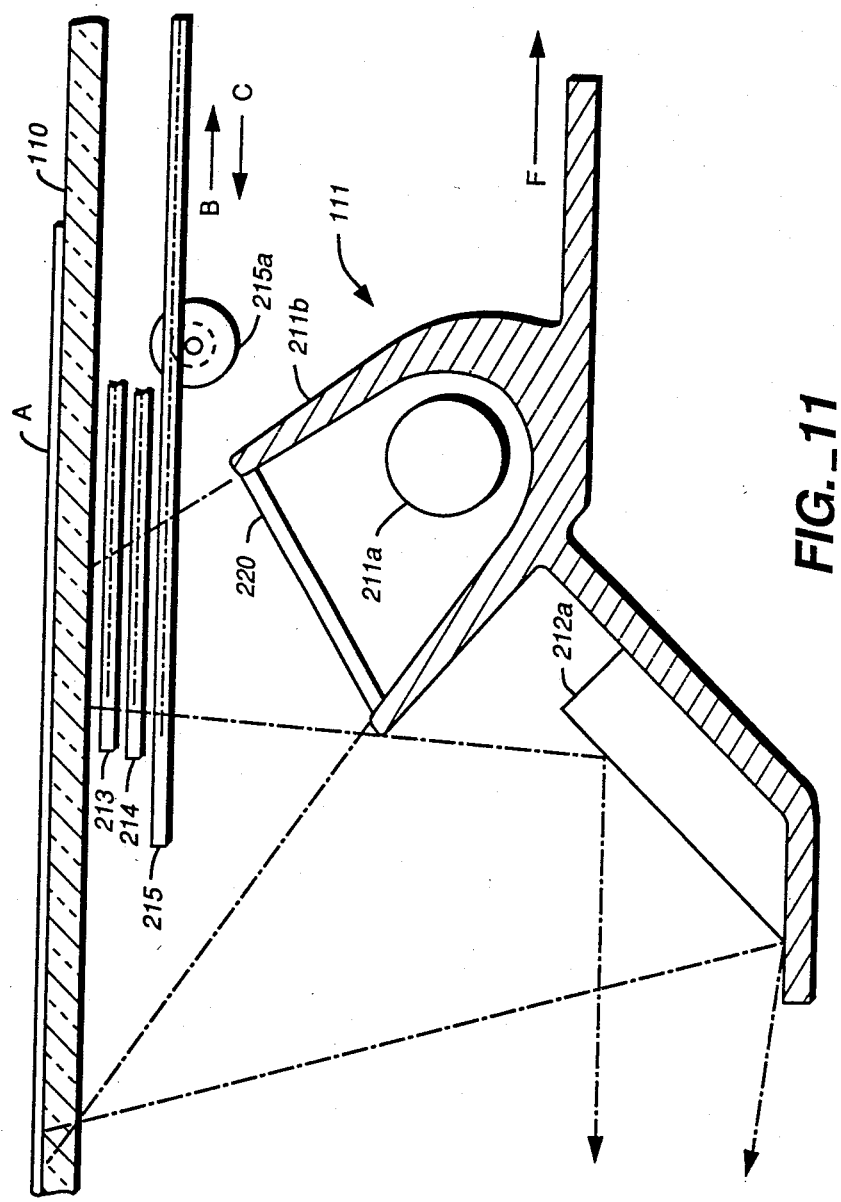
FIG._11

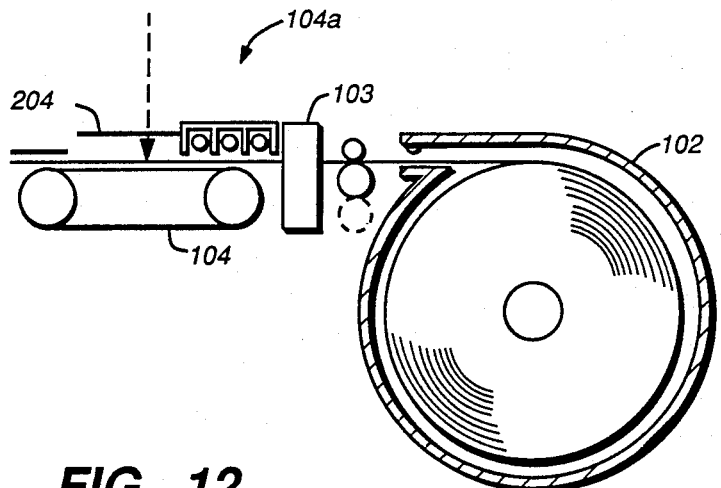
FIG._12
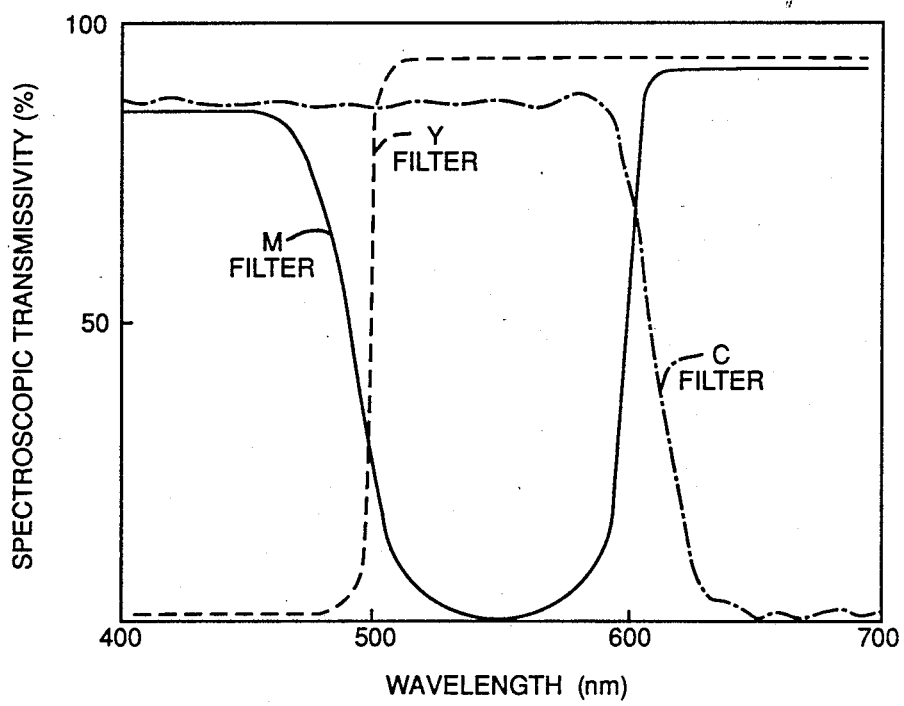
FIG._13

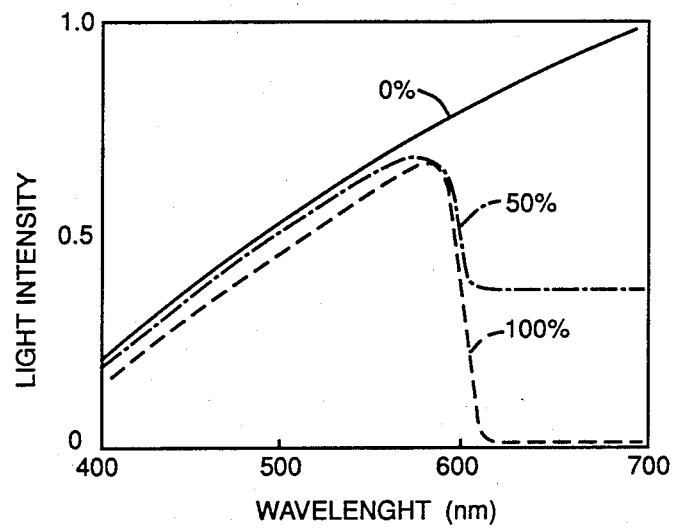
FIG._14
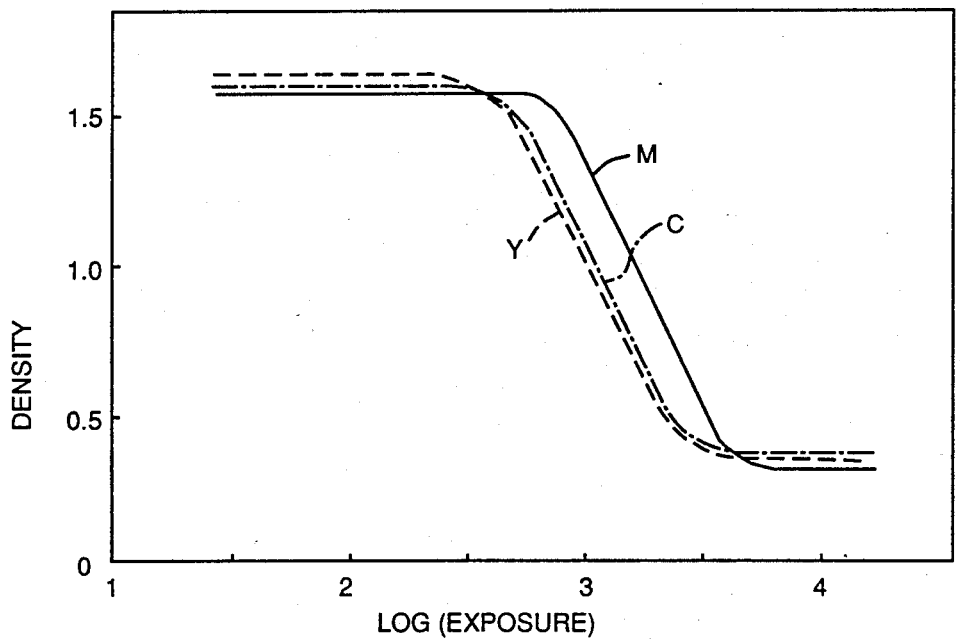
FIG._15

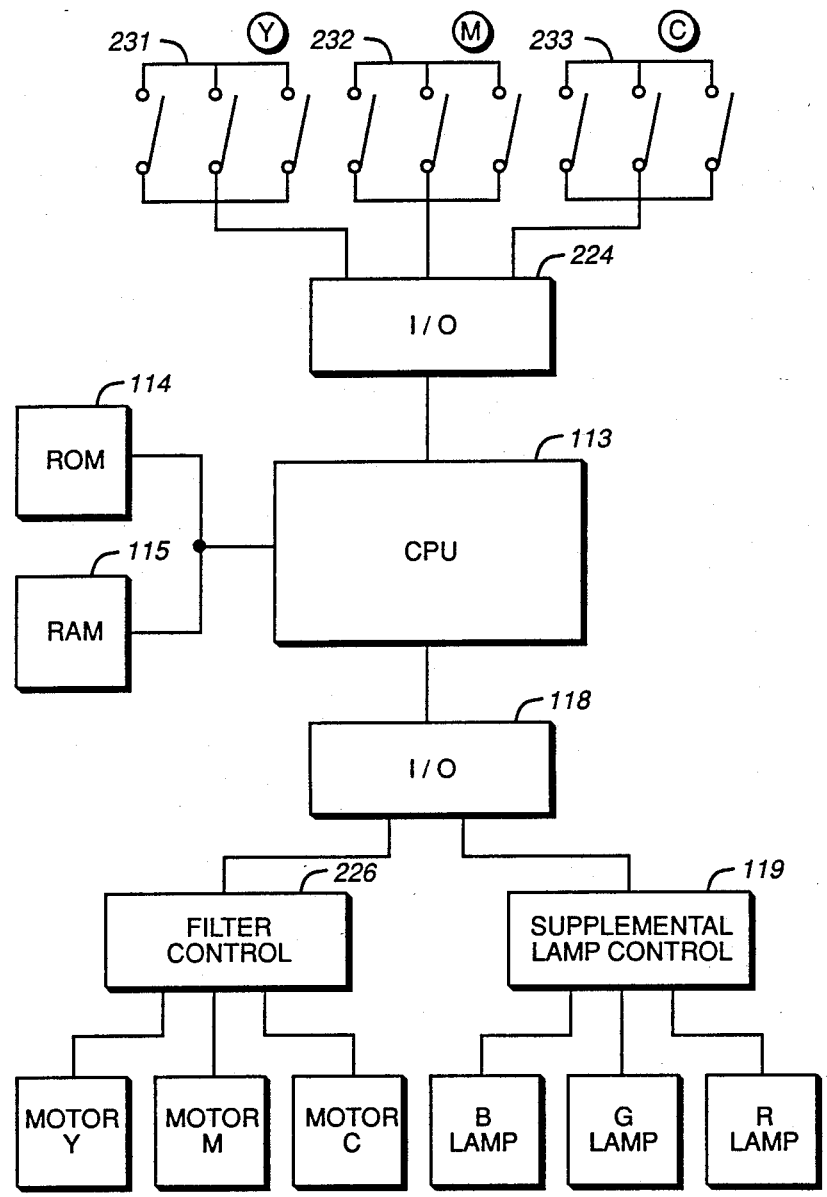
FIG._16

IMAGE FORMATION APPARATUS WITH SUPPLEMENTAL LIGHT SOURCE

BACKGROUND OF THE INVENTION

This invention relates to an apparatus for forming a visible image by chromogenic reaction of a colorless dye encapsulated in microcapsules and more particularly to such an image formation apparatus provided with supplemental light source for controlling the quality of produced image.

Japanese Patent Publication Tokkai Nos. 58-88739 and 59-149343 have disclosed a light and pressure sensitive image formation material composed of a light-accepting sheet having a base sheet coated with microcapsules encapsulating a photosensitive substance which hardens upon exposure to light and a colorless dye and an image transfer sheet coated with a developer material having chromogenic effects on the colorless dye. To briefly explain the method of image formation by using such a light and pressure sensitive material, an image-forming beam of light reflected, for example, from an original document is made incident on the light-accepting sheet to selectively harden the photosensitive substance encapsulated in those of the microcapsules exposed to light. If the image transfer sheet is thereafter superposed on the light-accepting sheet and pressed together between rollers, for example, those of the microcapsules not exposed to light and not hardened thereby are ruptured and allow the encapsulated colorless dye to flow out and react chromogenically with the developer material on the image transfer sheet.

As a material which hardens upon exposure to light, use is generally made of a monomer or cross-linking (bridge-forming) macromolecules with a polarization initiator. A polymerization initiator serves to respond to light in a specified range of wavelength to form radicals and to thereby initiate polymerization of a monomer or cross-linking combination of macromolecules. If so-defined Y capsules containing a photosensitive material which hardens upon exposure to blue (B) light and a colorless dye which turns yellow (Y), M capsules containing a photosensitive material which hardens upon exposure to green (G) light and a colorless dye which turns magenta (M), and C capsules containing a photosensitive material which hardens upon exposure to red (R) light and a colorless dye which turns cyanic (C) are uniformly distributed to form a light-accepting sheet and a white image-forming beam of light is made incident thereon, a color image can be formed by the aforementioned technology.

If a light-accepting sheet thus formed is used with a prior art image formation apparatus, however, a faithfully reproduced color image cannot always be obtained because the different photosensitive materials encapsulated in different types of capsules have different photosensitivity characteristics.

Photosensitivity characteristics include the so-called gamma (change in exposure/change in image density) which represents the dynamic range and sensitivity. FIG. 1 shows, for example, the relationship between image density and exposure for each of the three colors Y, M and C from Y, M and C capsules exposed respectively to B, G and R light by a prior art image formation apparatus. Since the gamma of Y capsules is extremely small and their sensitivity is somewhat high, Y comes out relatively strongly in high density areas but weakly in low density areas. This means that, when a produced full-color image is looked at as a whole, high density areas look greenish and low density areas look bluish.

It has been known to use filters to adjust sensitivity. For the situation discussed above, for example, a filter for absorbing C light may be used to control the spectroscopic energy distribution of the image-forming light, but gammas of Y, M and C capsules cannot be changed by filters alone. As a result, high density and low density areas tend to appear differently colored.

A method of controlling the gamma of photosensitive microcapsules has been disclosed, for example, in Japanese Patent Publication Tokkai No. 59-149343. In general, oxygen in air penetrates the resin shells of the microcapsules and the interior of the shells is in a saturated condition. When such photosensitive capsules are exposed to light, a part of the light energy is expended in consuming oxygen and the hardening takes place only after oxygen is consumed. In other words, oxygen serves to impede the hardening of the capsules by light. If such capsules are supplementally exposed to light, therefore, oxygen is additionally consumed and the hardening can be accelerated, or the gamma can be adjusted to a certain extent.

SUMMARY OF THE INVENTION

It is generally an object of the present invention to provide an image formation apparatus of the type provided with supplemental blue, green and red light sources for making an image on a sheet coated with rupturable microcapsules with which images of improved color quality can be obtained.

It is another object of the present invention to provide such an image formation apparatus which can be adjusted according to the particular photosensitivity characteristics of the sheet being used.

It is still another object of the present invention to provide such an image formation apparatus which can be adjusted to eliminate effects of ambient humidity.

The above and other objects of the invention can be achieved by providing a particularly designed control unit to such an image formation apparatus with supplemental light sources such that exposure of a light-accepting sheet to these light sources is effected according to the photosensitivity characteristics of the sheet, data received from a humidity sensor and/or data inputted by the user indicating the particular coloring desired on the image.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 1 is a graph of relationship between exposure and image density when an exemplary light-accepting sheet coated with three kinds of color microcapsules is used without supplemental light, FIG. 2 is a schematic front sectional view for showing the internal structure of a copier as an example of image formation apparatus embodying the present invention, FIG. 3 is a graph of relationship between exposure and image density like FIG. 1 except both a filter and the supplemental light source unit were used, FIG. 4 is a graph like FIG. 3 with the supplemental light source unit operated under the conditions of Test 4 shown in Table 1, FIG. 5 is a graph like FIG. 4 with the supplemental light source unit operated under the conditions of Test 5 shown in Table 1, FIG. 6 is a schematic front sectional view of another copier embodying the present invention, FIG. 7 is a block diagram of the copier shown in FIG. 6, FIG. 8 is a graph like FIG. 4 with the supplemental light source unit shown in FIG. 6 operated under the conditions of Test 1 shown in Table 2, FIG. 9 is a block diagram of another copier embodying the present invention structured as shown in FIG. 6, FIG. 10 is a graph like FIG. 8 with the supplemental light source unit shown in FIG. 6 operated under the conditions of Test 4 shown in Table 3, FIGS. 13 and 12 are schematic front sectional views of two separate parts of still another copier embodying the present invention, FIG. 13 is a graph showing spectroscopic transmissivity of the three filters shown in FIG. 11, FIG. 14 is a graph of the relationship between the filter position and light intensity, FIG. 15 is a block diagram of the copier of which portions are shown in FIGS. 11 and 12, and FIG. 16 is a graph showing photosensitivity characteristics of an exemplary light-accepting sheet.

In all these figures, components which are identical or equivalent to each other are indicated by the same numerals.

DETAILED DESCRIPTION OF THE INVENTION

As shown in FIG. 2 which illustrates a copier embodying the present invention for using a roll of light-accepting sheet uniformly coated with microcapsules of the three aforementioned kinds, a main drum 2 is disposed approximately at the center of its housing structure 1. Disposed to the left of the main drum 2 are a loading roller 31 around which a roll of light-accepting sheet 3 is carried and a take-up roller 32 for taking up the light-accepting sheet 3 such that one end of the roll of light-accepting sheet 3 is passed partially around the surface of the main drum 2 and wound around the take-up roller 32. The light-accepting sheet 3 is made of a base sheet of polyester or the like uniformly coated with Y, M and C capsules of the kinds explained above. The light-accepting-sheet 3 is so wound around the rollers 31 and 32 that its surface coated with the microcapsules face outward as it is passed around the main drum 2. The light-accepting sheet 3 is replaced by removing both the loading and take-up rollers 31 and 32 from the housing structure 1. Numeral 21 indicates a pressure-applying roller pressed against the main drum 2 from below.

At the top of the housing structure 1 is a document table 4 below which is an optical system 5 of a usual type found in prior art copiers, including a scanning lamp 51, mirrors 52–55 and a lens 56. The optical system 5 serves to scan a document on the document table 4 and to direct reflected light therefrom by of the mirrors 52–55 and the lens 56 onto an exposure point P on the main drum 2 to be made incident on the light-accepting sheet 3.

A supplemental light source unit 6 characterizing the present invention is disposed such that the light-accepting sheet 3 comes opposite thereto immediately before it reaches the exposure point P. The supplemental light source unit 6 includes light sources 61, 62 and 63 of three kinds having B, G and R filters in front of tungsten lamps or the like. Each of these three light sources 61, 62 and 63 is composed of a row of ten lamps arranged in the direction of the width of the light-accepting sheet 3 at intervals of 20 mm as will be explained more fully below such that the light-accepting sheet 3 can be exposed uniformly in the direction of this row. Each of these light sources 61, 62 and 63 is connected to a variable voltage source and is provided with its own control unit for independently controlling radiation intensity and time of exposure.

Paper cassettes 71–73 are provided on the right-hand side of the housing structure 1. Two of them (72 and 73) serve to contain transfer sheets 8 of standard sizes. The top one (71) is provided for containing transfer sheets 8 of any size for manual feeding. New supplies of transfer sheets 8 can be provided by removing and inserting these paper cassettes 71, 72 and 73. The image transfer sheets 8 comprise a base sheet of paper or polyester coated with a developer and are contained in these cassettes 71–73 with their coated surfaces facing upward. The developer has the chromogenic characteristics of causing colors Y, M and C to come out of the colorless dyes encapsulated in the Y, M and C capsules, respectively, upon contact with them. Paper feeder rollers 71a–73a are provided at front ends of the cassettes 71–73. Between the cassettes 71–73 and the main drum 2 are timing rollers 9. Between the timing rollers 9 and the feeder rollers 71a–73a are paper guides for directing the image transfer sheets 8 to the timing rollers 9. On the left-hand side of the housing structure 1 is a discharge tray 11. Between the main drum 2 and the discharge tray 11 are a conveyor belt 12, heat rollers 13 and discharge rollers 14, in this order. The upper one of the heat rollers 13 contains a heat source such as a halogen lamp to maintain the surface temperature of this upper roller at a specified level.

Inside a copier thus structured, the light-accepting sheet 3 is continuously supplied to the exposure point P by the rotations of the take-up and loading rollers 32 and 32 as well as the main drum 2. An original document to be copied is placed on top of the document table 4 and is scanned by the optical system 5 such that reflected image-forming light from the document is made incident on the light-accepting sheet 3 at the exposure point P. This exposure selectively hardens the microcapsules encapsulating a photopolymerizing substance and thereby forms an invisible image. In the meantime, an image transfer sheet 8 is supplied from one of the paper cassettes 71–73 through the guide 10 and stops at the position of and in contact with the timing rollers 9.

The timing rollers 9 serve to advance the image transfer sheet 8 such that its front edge matches that of the invisible image formed on the light-accepting sheet 3. The superposed light-accepting sheet 3 and the image transfer sheet 8 are pressed together between the main drum 2 and the pressure applying roller 21 such that those of the microcapsules not hardened by polymerization inside are ruptured and the encapsulated colorless dyes flow out thereof onto the superposed image transfer sheet 8, resulting in chromogenic reactions to cause colors to appear and to form a visible color image. The pressure applying roller 21 is set to apply a linear pressure of 10–35 kg/cm. The linear pressure is determined by the kind of photopolymerizing substance encapsulated in the microcapsules.

The image transfer sheet 8, after a color image has thus been formed thereon, is transported by the conveyor belt 12 and heated by the heat rollers 13 to a temperature of about 70°–150° C. such that the chromogenic reactions of the colorless dyes can be accelerated. If the image transfer sheet 8 is coated with a thermoplastic resin, the produced color image can thereby be made lustrous as disclosed in Japanese Patent Publication Tokkai No. 60-259490. The image transfer sheet 8, after heated by the heat rollers 13, is discharged onto the discharge tray 11 by the discharge rollers 14 while the light-accepting sheet 3 is taken up by the take-up roller 32.

The supplemental light source unit 6 is for the purpose of exposing the light-accepting sheet 3 to light immediately before it is exposed to the reflected image-forming light from the document such that the oxygen content of the microcapsules is reduced and that the gamma can be properly adjusted as explained broadly above.

To explain the principle more in detail, the microcapsules encapsulate within themselves oxygen in addition to a photosensitive material which hardens by light (=polymerization initiator+monomer or cross-linking macromolecules) and a colorless dye. When the polymerization initiator is exposed to light, radicals are formed and react with the monomer or the cross-linking macromolecules to start polymerization. These radicals are also highly reactive with oxygen, however, such that the presence of oxygen inside the capsules tends to delay the polymerization of monomer or cross-linking macromolecules. This tends to increase the gamma of the photosensitive material, adversely affecting its photosensitivity characteristics. The purpose of the supplemental light source unit 6, therefore, is to expose the capsules to light immediately before or after, or even simultaneously with their exposure to the image-forming light so as to generate radicals for reacting with oxygen and to thereby adjust the gamma.

According to the embodiment of the present invention shown in FIG. 2, the supplemental light source unit 6 is comprised of three sets of lamps, respectively for adjusting the gamma of the Y, M and C capsules sensitive respectively to B, G and R light. The higher the source voltages of the lamps 61–63 and the longer the exposure thereby, the more oxygen is removed from the microcapsules and hence the gamma is reduced. Optimum exposure periods are determined by the exposure, the traveling velocity of the light-accepting sheet 3 with respect to the lamps 61–63, etc.

By way of experimentation, a color filter 57 for absorbing blue light by density of 0.2 was disposed behind the lens 56 of the optical system 5 of the copier shown in FIG. 2 perpendicularly to the optical path therethrough. Power for the copy lamps 51 was set at 390 W×2=780 W and the source voltages of the supplemental lamps 61–63 were set as in Test 1 shown in Table 1 to copy a grey scale original with transmissive density changing by 0.15. The traveling speed of the light-accepting sheet 3 and the transfer sheet 8 was 4.5 mm/sec and the lamps 61–63 were left on. In other words, the time of exposure was determined simply by the speed of the sheets 3 and 8. For the purpose of comparison, the same original was copied at the exposure speed of 4.5 mm/sec without using the color filter 57 and leaving the supplemental lamps 61–63 all in the off condition. Power for the copy lamps 51 was reduced, however, to 350 W×2=700 W because of the absence of the filter 57.

For both copies thus obtained, Y, M and C densities were measured by a Macbeth reflection density meter. FIG. 3 shows the result obtained with the filter 57 and the supplemental light source units and is to be compared to FIG. 1 which shows the results of a comparison experiment. As mentioned above, the gammas are different for the Y, M and C capsules in the comparison experiment and the obtained copy was greenish in high density areas and blue in low density areas. With the filter 57 and the supplemental light source units 6 used, relative sensitivity of the Y capsules is corrected by the filter 57 and the gammas of the Y and C capsules are corrected by the supplemental light source unit 6 to come closer to the photosensitivity characteristic curve of the M capsules of which the gamma is the smallest. As a result, grey was reproduced correctly in all density regions and no particular coloring was observed. In both, the gradation number obtained was 4.

Under the same conditions, copies were made of a photograph. When both the filter and the supplemental light source unit 6 were used, both the skin and hair areas of people were faithfully reproduced but if neither was used, the skin color became bluish and the hair areas became greenish.

In a subsequent series of experiments, the same B-absorbing filter 57 was used and the voltages of the supplemental lamps 61–63 were changed as shown in Tests 2, 3 and 4 of Table 1. It was discovered that the photosensitivity characteristics of the Y, M and C capsules can be matched by properly adjusting the voltages of the lamps 61–63. In each of these combinations, the gammas of Y, M and C capsules were not only adjusted and matched but also significantly reduced. FIG. 4 shows the results obtained with the combination of voltages for Test 4 in Table 1 from the same grey scale original with steps of 0.15 with power for the copy lamps=380 W×2=760 W and the traveling speed of sheets=4.5 mm/sec. It is to be noted that the gamma values shown in FIG. 4 are significantly smaller than those in FIG. 3. Reproducibility was therefore also improved significantly and the gradation number was 9. In summary, gradation reproducibility can be improved by controlling the voltages of the supplemental lamps 61–63 not only to match the gammas of the Y, M and C capsules but also to reduce them.

With reference again to Table 1, Test 5 was carried out without the filter 57 and by reducing the power for the copy lamps to 330 W×2=660 W. FIG. 5 shows the result. Although the maximum saturated density value is somewhat reduced from that shown in FIG. 4, the gammas of the Y, M and C capsules could still be matched and reduced without the filter 57. A copy obtained by this combination of voltages from a photograph showed no specific coloring in the skin or hair areas and a copy with good reproducibility was obtained.

Even if the supplemental light source unit 6 is used to consume oxygen as described above, it will have no effect if oxygen is thereafter allowed to invade the capsules through their resin shells. Since these resin shells become permeable to oxygen quickly as ambient humidity rises, correction of gammas cannot be achieved satisfactorily if exposure is effected in the same way when humidity is high as when humidity is low. FIG. 6 shows another image formation apparatus embodying the present invention with which supplemental exposure to light is varied according to ambient humidity such that high-quality copies can be obtained consistently even when ambient humidity is high. To explain its structure, numeral 101 indicates its housing structure with a container cassette 102 for a roll of light-accepting sheet uniformly coated with microcapsules of the aforementioned three types Y, M and C. The light-accepting sheet pulled out of its container cassette 102 is passed through a cutter 103, over a supporting table 104, between pressure-applying rollers 105 and by guiding rollers 161, 162 and 163 to be directed out of the housing structure 101. On the opposite side of the housing structure 101 are a supply cassette 107 for placing image transfer sheets which are directed to the pressure-applying rollers 105 and then through heat rollers 108 to be discharged onto a discharge tray. On top of the housing structure 101 is a document table 110. An optical system 111 including mirrors is disposed below the document table 110. The optical system 111 serves to scan an original document placed on the document table 110 and to direct a reflected image forming beam of light therefrom onto the supporting table 104 to form an invisible image on the light-accepting sheet. Above the supporting table 104 is a supplemental light source unit 104a with three supplemental light sources 141, 142 and 143, each including an array of tungsten lamps 141a, 142a or 143a arrayed in the direction of the widths of the light-accepting sheet and a filter 141b, 142b or 143b in front thereof for passing B, G or R light, respectively. Numeral 112 indicates a humidity sensor disposed at a lower right-hand corner inside the housing structure 101. The humidity sensor 112 may be of a type made of a porous zirconium-magnesia ceramic material.

As shown schematically in FIG. 7, the copier shown in FIG. 6 is generally controlled by a central processing unit CPU 113 of which control programs are already stored in a read-only memory ROM 114. A random-access memory RAM 115 is provided to be used as a working area. Humidity data detected by the humidity sensor 112 are digitized by an analog-to-digital converter A/D 116 and received by the CPU 113 through an interface circuit I/0 117. As will be explained more fully below, the CPU 113 calculates the voltages for the supplemental light sources 141, 142 and 143 on the basis of the humidity data thus received as well as data stored in the ROM 114 and the calculated results are transmitted through another interface circuit I/0 118 to a supplemental light source control unit 119 which serves to control the voltages of the tungsten lamps 141a, 142a and 143a.

In order next to discuss the effects of voltages applied to the supplemental light sources 141, 142 and 143, reference is again made to FIG. 1 which represents spectroscopic characteristics when neither filters nor supplemental exposure was used. The data represented in FIG. 1 were taken when temperature was 30° C. and humidity was 50%. In a series of experiments for studying the effects of voltages applied to the supplemental light sources 141, 142 and 143, copies were made under the same conditions as for FIG. 1 except voltages applied to the light sources 141, 142 and 143 were changed with humidity as shown in Table 2. FIG. 8 shows the result of Test 1 shown in Table 2, indicating that an image with superior reproducibility with 9 gradations was obtained. With the same voltages applied to the supplemental light sources 141, 142 and 143, copies of photographs were produced and examined. Even without any filters high-quality images could be obtained with faithfully reproduced skin color, etc.

As humidity is further increased, gradation reproducibility becomes poorer. Table 2 also shows a relationship between gradation reproducibility and humidity. Although the voltage in Test 1 was satisfactory when humidity was 50%, it gradually ceases to be so. Gradation number drops to 5 as humidity is increased to 85%. If the voltages were increased with humidity as shown in Table 2, however, gradation number could be maintained at 9, and 8 even at humidity of 85%. Data as shown in Table 2 on relationship between voltages to be applied to the individual supplemental light sources 141, 142 and 143 and humidity are stored in the ROM 114 such that the CPU 113 can set voltage values according to the input data from the humidity sensor 112.

With a copier thus structured and controlled, images of high quality can be formed independently of ambient humidity. Although the present invention was described by way of only one example whereby B, G and R light beams were controlled by voltages, they may be controlled by other means such as duty ratio and on-and-off timing. The number of supplemental light sources need not be three. Depending on the properties of the light-accepting sheet, the number of supplemental light sources may be appropriately changed.

A copier structured, for example, as shown in FIG. 6 may be modified such that a copy can be obtained with a selected color particularly emphasized without using any filter. As indicated in FIG. 9 which is a block diagram of a control unit for such a modified copier, there is provided on its control panel (not shown in FIG. 6) color dials corresponding to Y, M and C. As these dials are turned, resistance of variable resistors 141c, 142c and 143c connected thereto is changed and these changes in resistance are digitized by their respective analog-to-digital converters A/D 141d, 142d and 143d and transmitted to the CPU 113. Control data are thereupon transmitted from the CPU 113 to the supplemental light control unit 119 as explained above in connection with FIG. 7. In this example, let us assume that the supplemental light source control unit 119 is adapted to control duty ratios of the lamps 141a, 142a and 143a. In order next to discuss the effects of duty ratios on the quality of resultant image, reference is again made to FIG. 1 which represents spectroscopic characteristics when neither filters nor supplemental exposure was used. As explained above, color images obtained under these conditions are greenish in high density areas and bluish in low density areas. By comparison, a copier controllable as shown by FIG. 9 was used and if the duty ratios of supplemental light sources 141, 142 and 143 were selected as in Test 1 shown in Table 3, gradation number was 4 and gradation reproducibility was not much better than when the supplemental light source unit 104a was not used at all but improvements were observed in copies of photographs. When duty ratios were changed as shown in Tests 2, 3 and 4, gradation reproducibility improved gradually and the gradation number of the same grey scale was 9 by Test 4. FIG. 10 shows the density characteristics of an image thus obtained. Test 5 was done without a filter for the image-forming light. It shows that good copies can be obtained even without such a filter if duty ratios are appropriately selected.

With combinations of duty ratios shown in Table 3, copies with faithful color reproducibility can be obtained. If a copy is desired with a certain color particularly emphasized, the combinations shown in Table 3 may be used as a reference and the duty ratio of the supplemental light source of the corresponding color should be changed. Combinations like those shown in Table 3 as well as coloring coefficients are stored in the ROM 114 such that if a command to change coloring is received from one of the variable resistors 141c, 142c or 143c, the CPU 113 multiplies this command value by the specified coloring coefficient to obtain a duty ratio to be outputted to the supplemental light source control unit 119. If a yellowish image is desired, for example, the user turns the Y color adjusting dial in the direction for making it denser. In response, the duty ratio for the source lamps for B light is set higher and a desired yellowish image is obtained. Depending on how much the dial is turned, the increase in the corresponding duty ratio is controlled. The explanation given above, too, should be regarded as illustrative. Exposure may be controlled by voltage as explained above by way of FIG. 7 as well as by duty ratio.

Image formation apparatus disclosed above are all adapted to control their supplemental light source according to average photosensitivity characteristics of the light-accepting sheet which is being used. Photosensitivity characteristics of light-accepting sheets change, however, from one production lot to another. If images are formed by setting a supplemental light source unit uniformly according to such an average value, quality of the produced images cannot always be maintained at a high level. The present invention is also addressed to this problem.

Still another copier embodying the present invention which responds to this problem and is generally structured as shown in FIG. 6 is described next by way of FIG. 11 which shows a portion of optical system 111 and FIG. 12 which shows a screen 204 having a slit covering the supporting table 104. With reference firstly to FIG. 11, the optical system 111 has as its light source a linear light source type halogen tungsten lamp 211a surrounded by a reflector 211b provided for improved efficiency for scanning. The shape of its interior surface is substantially paraboloidal such that a substantially linear light beam is made incident on an original document A placed on the document table 110. The source lamp 211a is adapted to move horizontally together with a mirror 212a as shown by the arrow F to scan the document A. Disposed between the source lamp 211a and the document table 110 are filters of three different kinds 213, 214 and 215 which are primarily for correcting the photosensitivity characteristics, and sensitivity in particular, of the light-accepting sheet although they may be used also for adding particular coloring to a formed image according to the user's choice and input through a control panel (not shown).

The properties of these filters (Y filter 213, M filter 214 and C filter 215) are shown in FIG. 13. As shown therein, the Y filter 213 is adapted to reflect B light of 400–500 nm in wavelength, the M filter 214 is adapted to reflect G light of 500–600 nm in wavelength and the C filter 215 is adapted to reflect R light of 600–700 nm in wavelength. Examples of these filters 213, 214 and 215 include dichroic filters with many coated layers over a glass plate. These filters 213, 214 and 215 are placed parallel to the direction of the linear light source lamp 211a and can be moved by small distances in the directions shown by arrows B and C in FIG. 11 perpendicularly to the direction of the slit in the screen 204 over the supporting table 104 shown in FIG. 12. In FIG. 11, a stepping motor 215a is shown which is affixed to a pinion engaged to a rack affixed to the C filter 215 so as to control the motion of the C filter 215. The Y and G filters 213 and 214 are similarly affixed to rack gears and provided with individual stepping motors (not shown) which control their motion respectively.

As the filters 213, 214 and 215 are moved in the direction of B or C by their associated stepping motors, the ratio of areas by which the filters 213, 214 and 215 screen the source beam changes. In other words, if one of them is moved in the direction of B, its areal ratio is reduced while, if it is moved in the direction of C, its areal ratio is increased. FIG. 14 shows the relationship between the areal ratio (0%, 50% and 100%) by which the C filter 215 screens the source beam and the light intensity. As clearly indicated thereby, R light in the wavelength range of 600–700 nm is absorbed approximately proportionally to the areal ratio by which the C filter 215 is inserted into the source beam. If the original A is scanned by a beam with less R light, the reflected beam therefrom also has less R light and those of the microcapsules which are sensitive to R light harden less readily. The image thus formed is therefore strong in cyanic.

With a copier thus structured, the areal ratio of each filter inserted into the source beam, and hence the intensity of each color beam, can be continuously varied. In other words, the photosensitivity characteristics of the Y, M and C capsules can be continuously varied. Moreover, the energy loss by this control can be kept to a minimum because there is no reflection where the source beam is not screened by the filters 213, 214 and 215. A further advantage of the present invention is that local unevenness in coloring in the image can be prevented because the filters 213, 214 and 215 move perpendicularly to the direction of the slit in the screen 204.

Although use of reflective filters was disclosed above in connection with FIGS. 11–13, filters which absorb B, G and R light, respectively, may be used. Alternatively, filters to be used may be B, G and R filters which either reflect or absorb Y, M and C light although the energy loss tends to be large. Moreover, color polyethylene phthalate or gelatin filters may be used instead of dichroic filters. In FIG. 11, numeral 220 indicates another filter for absorbing near-infrared light in wavelength range of 0.8–2.5 μm made, for example, of phosphate glass. This serves to prevent the document table 110 and the document A itself from heating up. With such a filter inserted, uniformity among the Y, M and C filters 213, 214 and 215 is not stringently required and inexpensive filters may be used.

As shown by the block diagram of FIG. 15, the copier which has been described above by way of FIGS. 11–14 is provided with dip switches 231, 232 and 233 each corresponding to the photosensitivity characteristics of the Y, M and C capsules and each comprised of three switches. Thus, $2^3 = 8$ different conditions can be set by these switches 231, 232 and 233. Each roll of light-accepting sheet carries thereon an instruction to the user how these switches should be set when it is used such that the characteristics data best suited to that particular roll are inputted through an interface circuit 224 to the CPU 113. On the basis of such characteristics data, the CPU 113 sets the numbers of pulse to be given to the stepping motors for controlling the displacements of the filters 213, 214 and 215 to achieve correct areal ratios as well as exposure by B, G and R light from the supplemental light sources 141–143. Conversion coefficients necessary for such calculations are already stored in the ROM 114.

After these calculations are completed, data indicative of the required areal ratios are transmitted to a filter control section 226 which causes the stepping motors to move the filters 213, 214 and 215 accordingly and data indicative of the required exposure are transmitted to the exposure control section 119 to activate the supplemental light sources 141, 142 and 143. Control of exposure may be effected by changing voltage or duty ratio as explained above.

Next, a method of setting the displacements of filters and exposure by the supplemental light sources according to the sensitivity of a given light-accepting sheet are explained more fully.

Let us assume that a given light-accepting sheet has photosensitivity characteristics as shown in FIG. 16 obtained by measuring the Y, M and C densities of a copy made of a grey scale original of density 0.05–1.85 (density pitch=0.1) without using any filter or supplemental light sources. The three curves in FIG. 16 are equally sloped and this means that the gammas of the Y, M and C capsules are approximately the same but the sensitivity of the M capsules is shown to be lower by 0.6. This means that images formed by this light-accepting sheet are reddish and bluish.

In order to correct the situation, G light should be given more than B and R light by an equivalent of 0.6 in density. By selecting the areal ratios by which the Y, M and C filters cover the source beam to be 30%, 0% and 25%, respectively, the Y and C curves of FIG. 16 could be matched to the M curve and an image with no dominant coloring could be obtained. In this manner, sensitivity of light-accepting sheets can be corrected. A light-accepting sheet from each production lot is thus tested and recorded. The user is to consult such a record and to operate the dip switches. In response, the conversion coefficients stored in the ROM are used by the CPU in determining the positions of the filters for proper corrections of sensitivity.

The foregoing description of preferred embodiments of the invention has been presented for purposes of illustration an description. It is not intended to be exhaustive or to limit the invention to the precise form and many modifications and variations are possible in light of the above teaching. For example, although correction of gamma by means of supplemental light sources was explained above, gammas can be corrected also by using Y, M and C filters and the supplemental light sources may be used for correcting sensitivity. Instead of dip switches, use may be made of dials or a keyboard for input of data. Alternatively, photosensitivity characteristics of each light-accepting sheet may be recorded on a magnetic tape or as a bar code on its cassette such that they are read automatically by a data reader mounted to the housing structure. Such automatic means have the advantage of preventing input errors by the user.

Moreover, use of stepping motors is not essential. If the filters are arranged to be moved manually by mechanical means, the apparatus can be made simpler in structure and less costly to manufacture. The filters need not be disposed at the positions shown in FIG. 11. They may be disposed at any position along the optical path of the image-forming beam. They may be placed, for example, immediately in front of or behind the lens. As long as the filters are made movable perpendicularly to the direction of the slit 204, unevenness in the coloring of image can be prevented. In summary, any modifications and variations that may be apparent to a person skilled in the art are intended to be included within the scope of this invention.

TABLE 1

| | Voltage | | | | Reproducibility of |
|---|---|---|---|---|---|
| | B | G | R | Gradation | Photograph |
| TEST 1 | 8.3$^V$ | 0$^V$ | 4.0$^V$ | 4 | Good |
| TEST 2 | 10.3 | 3.0 | 7.0 | 6 | Good |
| TEST 3 | 11.2 | 5.0 | 7.7 | 7 | Excellent |
| TEST 4 | 12.0 | 6.0 | 8.2 | 9 | Extremely Excellent |
| TEST 5 | 12.2 | 6.5 | 10.0 | 8 | Extremely Excellent |

TABLE 2

| | | Voltage | | | Gradation | Gradation by voltages of |
|---|---|---|---|---|---|---|
| Humidity | Test | B | G | R | tion | TEST 1 |
| 50% | 1 | 12.2$^V$ | 6.5$^V$ | 10.0$^V$ | 9 | 9 |
| 60 | 2 | 13.0 | 7.3 | 10.5 | 9 | 8 |
| 70 | 3 | 14.1 | 8.4 | 11.1 | 9 | 7 |
| 80 | 4 | 15.2 | 10.0 | 13.0 | 8 | 5 |

TABLE 3

| | Duty | | | | Reproducibility of |
|---|---|---|---|---|---|
| | B | G | R | Gradation | Photograph |
| TEST 1 | 0.40 | 0 | 0.20 | 4 | Good |
| TEST 2 | 0.56 | 0.11 | 0.37 | 6 | Good |
| TEST 3 | 0.80 | 0.25 | 0.38 | 7 | Excellent |
| TEST 4 | 0.90 | 0.35 | 0.40 | 9 | Extremely Excellent |
| TEST 5 | 0.91 | 0.40 | 0.80 | 8 | Excellent |

What is claimed is:

1. In an image formation apparatus which forms an image by exposing a light-accepting sheet to image forming light, said light-accepting sheet being uniformly coated with microcapsules of different kinds, each kind of said microcapsules encapsulating a photosensitive material which hardens by light of a specified wavelength range, said image forming light including beams in said wavelength ranges, the improvement wherein said image formation apparatus includes supplemental light sources for uniformly exposing said light-accepting sheet individually to light beams in said specified wavelength ranges and control means for individually controlling exposure by said supplemental light sources such that photosensitivity characteristics of said microcapsules are matched.

2. The apparatus of claim further comprising a humidity sensor which outputs humidity data indicative of ambient humidity detected thereby and means for controlling said supplemental light sources according to said humidity data.

3. The apparatus of claim 1 further comprising data input means for receiving exposure data, said control means further serving to control exposure by said supplemental light sources according to said exposure data.

4. In an image formation apparatus having a supplemental light source unit for forming an image on a light-accepting sheet coated with photosensitive microcapsules by exposing said light-accepting sheet to an image forming beam of light and to supplemental light from said supplemental light source unit, the improvement wherein said image formation apparatus further comprises a humidity sensor which outputs humidity data indicative of ambient humidity detected thereby and means for controlling said supplemental light source unit according to said humidity data.

5. A supplemental light source unit for an image formation apparatus, said supplemental light source unit comprising
a plurality of supplemental light sources each exposing a light-accepting sheet to a beam of light in a specified wavelength range,
data input means for receiving coloring data, and
control means for controlling exposure by each of said supplemental light sources according to said coloring data.

6. The supplemental light source unit of claim 5 wherein said supplemental light sources include a blue light source, a green light source and a red light source.

7. The supplemental light source unit of claim 6 wherein said input means include yellow, magenta and cyanic color control dials each connected to a variable resistor for continuously varying exposure by said supplemental light sources.

8. In an image formation apparatus having a supplemental light source unit for exposing a light-accepting sheet to beams of light in wavelength ranges which harden photosensitive microcapsules coating said light-accepting sheet, the improvement wherein said supplemental light source unit comprises
input means for receiving data indicative of photosensitivity characteristics of said light-accepting sheet, and
setting means for setting exposure by said supplemental light source unit according to said data.

9. The image formation apparatus of claim 8 wherein said supplemental light source unit is comprised of a plurality of supplemental light sources each emitting a light beam of different wavelength range.

10. The image formation apparatus of claim 8 wherein said input means include a plurality of dip switches.

11. The image formation apparatus of claim 8 further comprising a set of color filters and filter driving means for individually moving said color filters according to said exposure set by said setting means.

* * * * *

UNITED STATES PATENT AND TRADEMARK OFFICE
CERTIFICATE OF CORRECTION

PATENT NO. : 4,910,550

DATED : March 20, 1990

INVENTOR(S) : Kunio Ohashi, et al.

It is certified that error appears in the above-identified patent and that said Letters Patent is hereby corrected as shown below:

Column 3, line 19, change "13" to --11--.

Column 3, line 63, after "by" insert --way--.

Column 12, line 54 (Claim 2, line 1), after "claim" insert --1--.

Signed and Sealed this

Eighth Day of October, 1991

Attest:

HARRY F. MANBECK, JR.

*Attesting Officer*  *Commissioner of Patents and Trademarks*